(12) United States Patent
Stering

(10) Patent No.: US 9,917,012 B2
(45) Date of Patent: Mar. 13, 2018

(54) DICING METHOD FOR WAFER-LEVEL PACKAGING AND SEMICONDUCTOR CHIP WITH DICING STRUCTURE ADAPTED FOR WAFER-LEVEL PACKAGING

(71) Applicant: ams AG, Unterpremstaetten (AT)

(72) Inventor: Bernhard Stering, Stainz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/313,489

(22) PCT Filed: May 21, 2015

(86) PCT No.: PCT/EP2015/061302
§ 371 (c)(1),
(2) Date: Nov. 22, 2016

(87) PCT Pub. No.: WO2015/181050
PCT Pub. Date: Dec. 3, 2015

(65) Prior Publication Data
US 2017/0200647 A1 Jul. 13, 2017

(30) Foreign Application Priority Data
May 28, 2014 (EP) .................................... 14170380

(51) Int. Cl.
*H01L 21/00* (2006.01)
*H01L 21/78* (2006.01)
(Continued)

(52) U.S. Cl.
CPC ............ *H01L 21/78* (2013.01); *H01L 21/561* (2013.01); *H01L 21/6836* (2013.01);
(Continued)

(58) Field of Classification Search
CPC ... H01L 21/78; H01L 21/561; H01L 21/6836; H01L 21/3114; H01L 21/05; H01L 21/13; H01L 2221/68327
(Continued)

(56) References Cited

U.S. PATENT DOCUMENTS 6,338,980 B1   1/2002   Satoh
8,652,939 B2   2/2014   Sung et al.
(Continued)

FOREIGN PATENT DOCUMENTS

JP   2007012712 A   1/2007
JP   2008141019 A   6/2008

*Primary Examiner* — Trung Q Dang
(74) *Attorney, Agent, or Firm* — McDermott Will & Emery LLP

(57) ABSTRACT

A semiconductor substrate (1) is provided with integrated circuits. Dicing trenches (7) are formed in the substrate (1) between the integrated circuits, a polyimide layer (8) spanning the trenches (7) is applied above the integrated circuits, a tape layer (14) is applied above the polyimide layer (8), and a layer portion of the substrate (1) is removed from the substrate side (17) opposite the tape layer (14), until the trenches (7) are opened and dicing of the substrate (1) is thus effected. The polyimide layer (8) is severed in sections (18) above the trenches (7) when the tape layer (14) is removed. The semiconductor chip is provided with a cover layer (11) laterally confining the polyimide layer (8) near the trenches (7), in particular for forming breaking delimitations (9).

10 Claims, 8 Drawing Sheets

(51) Int. Cl.
*H01L 21/56* (2006.01)
*H01L 23/31* (2006.01)
*H01L 21/683* (2006.01)
*H01L 23/00* (2006.01)

(52) U.S. Cl.
CPC .......... *H01L 23/3114* (2013.01); *H01L 24/05* (2013.01); *H01L 24/13* (2013.01); *H01L 2221/68327* (2013.01); *H01L 2224/0401* (2013.01)

(58) Field of Classification Search
USPC ........................................................ 257/737
See application file for complete search history.

(56) References Cited

U.S. PATENT DOCUMENTS

| | | | |
|---|---|---|---|
| 2004/0113283 A1* | 6/2004 | Farnworth | H01L 21/3043 257/782 |
| 2012/0161332 A1 | 6/2012 | Chua et al. | |
| 2013/0087370 A1* | 4/2013 | Inaba | H05K 3/26 174/254 |
| 2013/0320519 A1 | 12/2013 | Kim et al. | |
| 2014/0346669 A1* | 11/2014 | Wang | H01L 24/13 257/737 |

\* cited by examiner

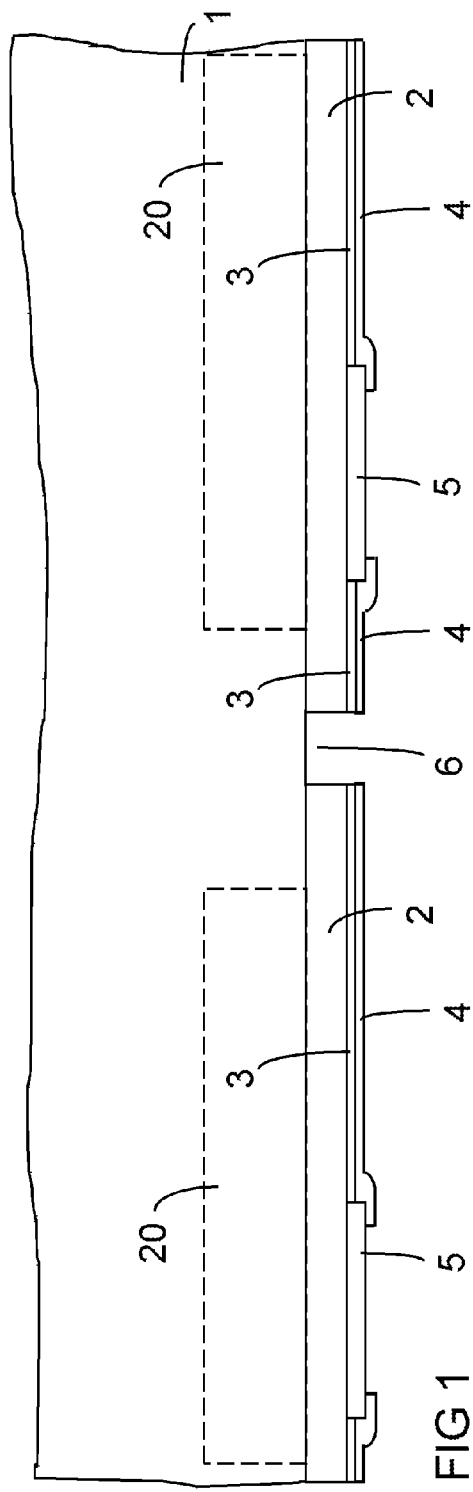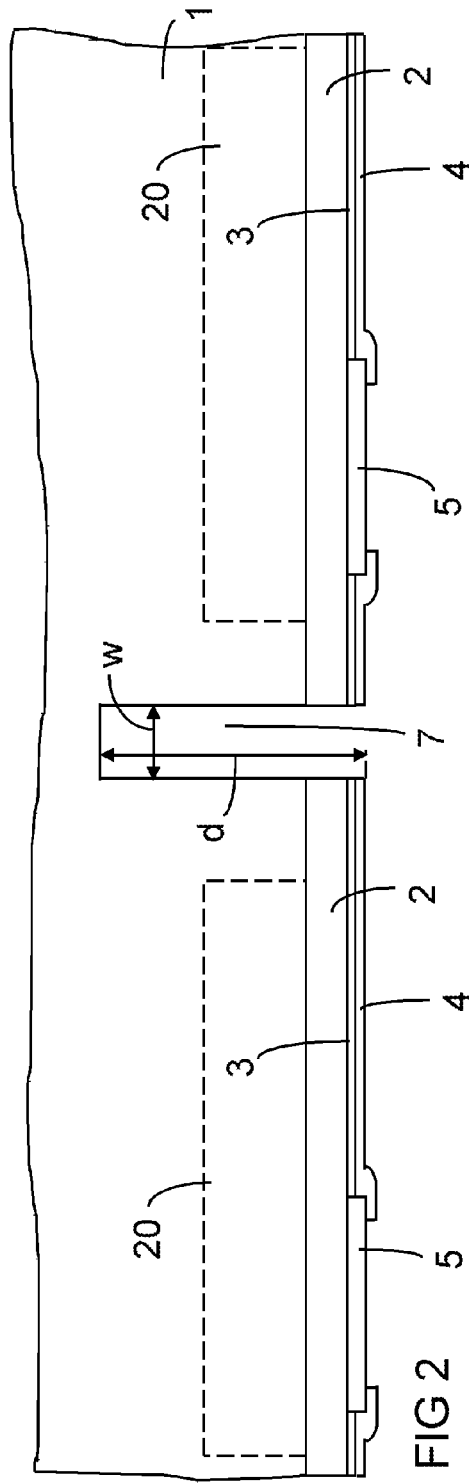

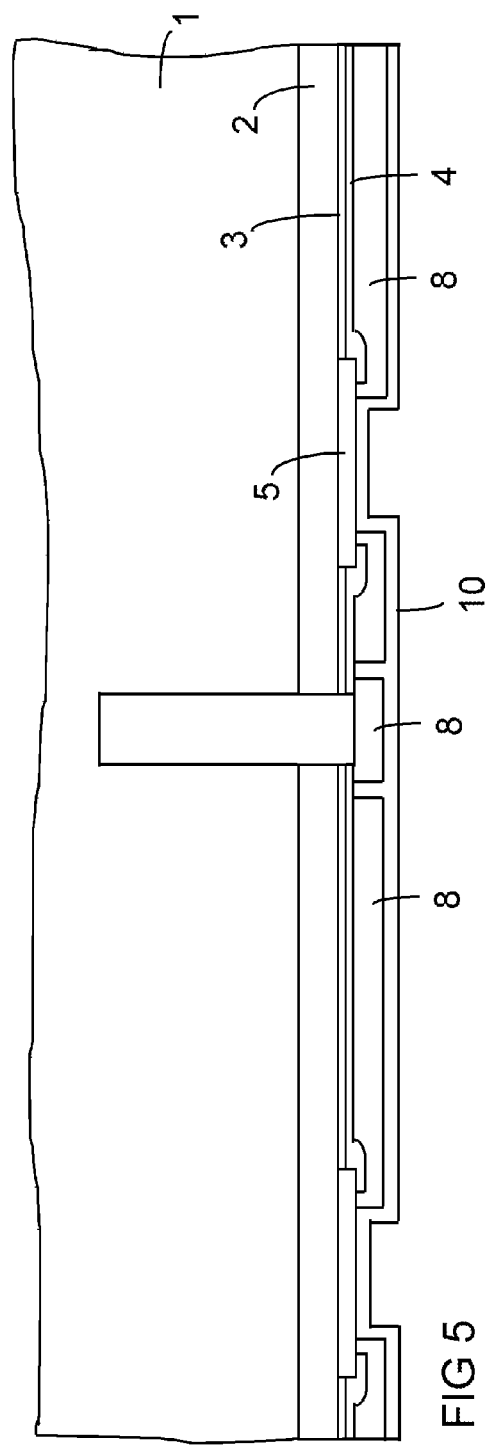
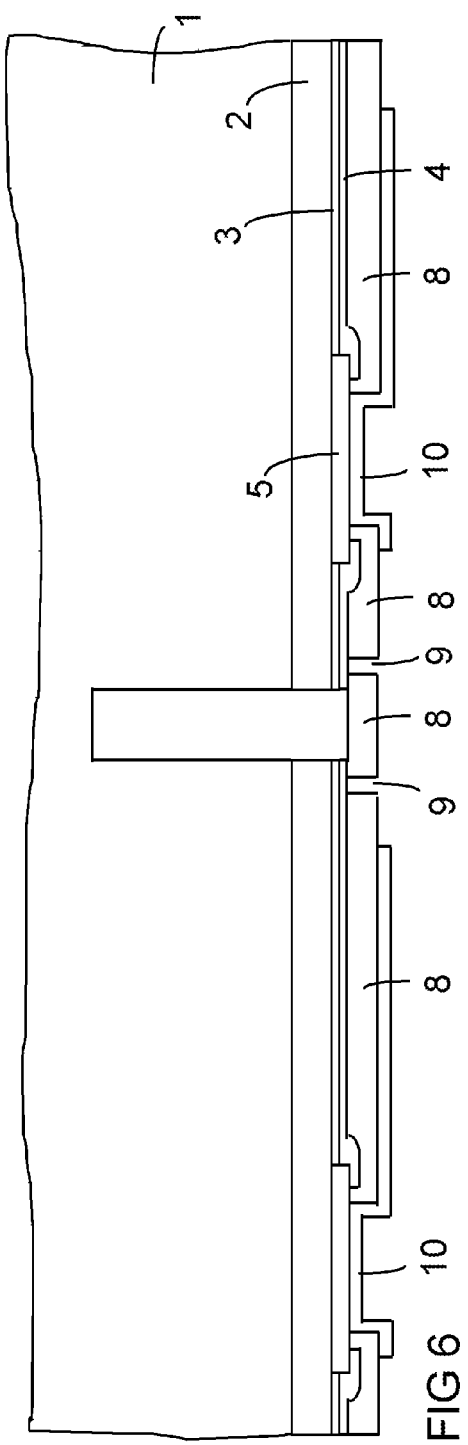

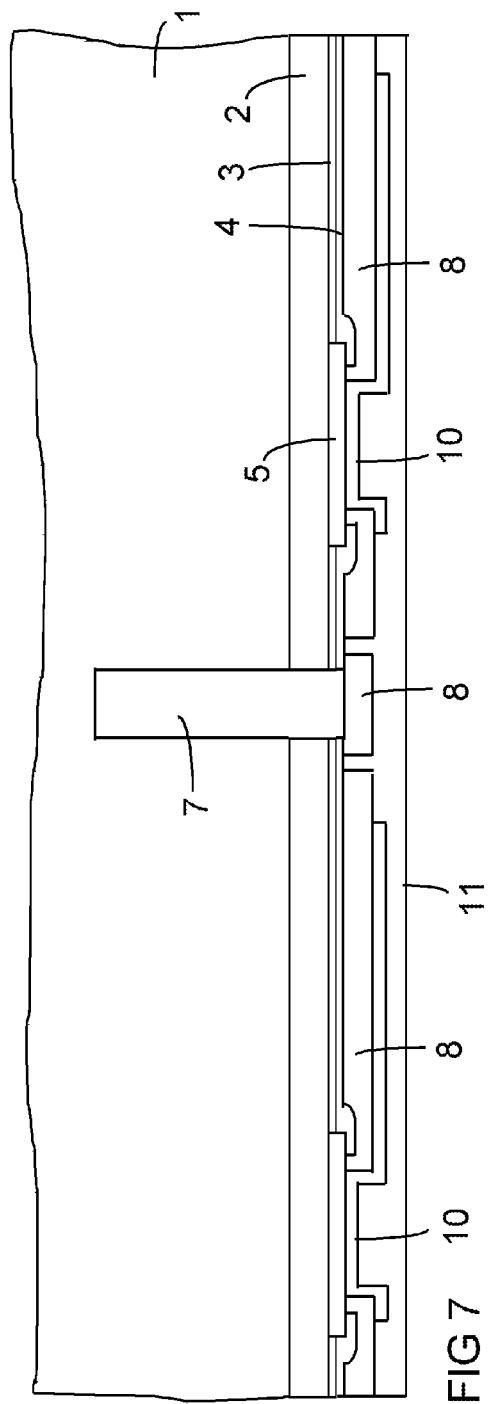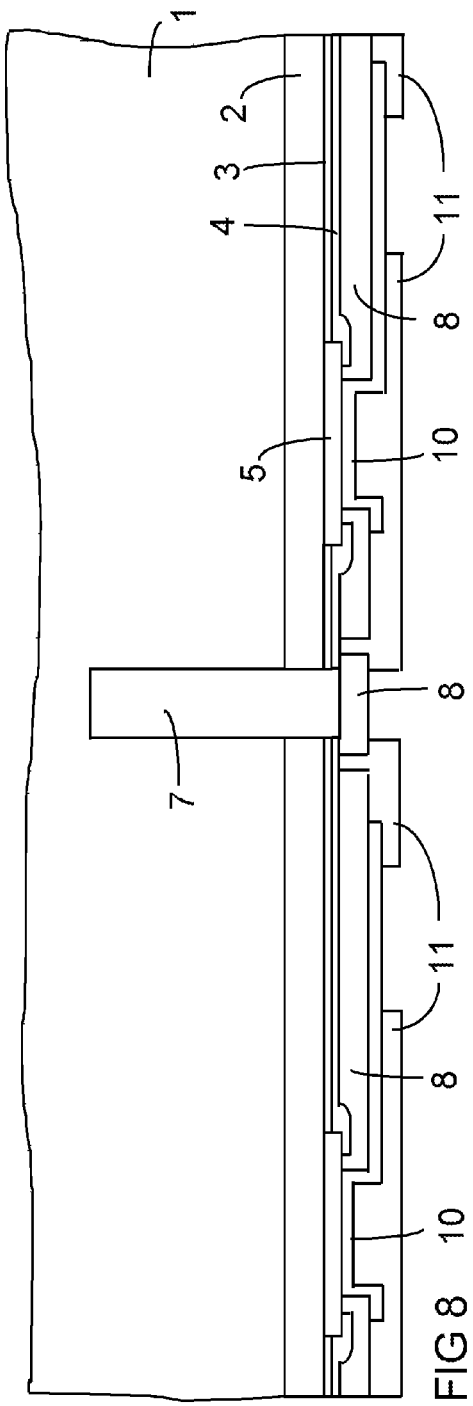

DICING METHOD FOR WAFER-LEVEL PACKAGING AND SEMICONDUCTOR CHIP WITH DICING STRUCTURE ADAPTED FOR WAFER-LEVEL PACKAGING

BACKGROUND OF THE INVENTION

Wafer-level packaging is a technology of packaging integrated circuit chips still forming part of a wafer or semiconductor substrate on which the chips are produced. Electrically conductive contact pads are provided for external electric connections. Bump contacts are applied on the contact pads before the chips are separated by wafer dicing.

U.S. Pat. No. 8,652,939 B2 discloses a method for die assembly. A trench is formed extending from an active surface of a semiconductor substrate comprising a plurality of integrated circuit dies having connector terminals extending from the active surface. The trench extends into, but not through, the semiconductor substrate. A protective layer, which may be a polyimide or an underfill material, is formed overlying the active surface and the trench and covering the lower portion of the connector terminals. A pre-dicing opening is formed in the protective layer and within the trench. A backgrinding tape, which is afterwards mechanically removed or can be released by curing with an ultra-violet light source, is applied over the active surface, the protective layer and the connector terminals. The substrate material is removed from the backside until the pre-dicing opening is exposed.

SUMMARY OF THE INVENTION

The dicing method for wafer-level packaging comprises providing a semiconductor substrate with integrated circuit regions, forming trenches in the substrate between the integrated circuit regions, applying a polyimide layer above the integrated circuit regions and above the trenches, applying a tape layer above the polyimide layer, the tape layer extending over the integrated circuit regions and the trenches, and removing a layer portion of the semiconductor substrate from the substrate side opposite the tape layer, until the trenches are opened and dicing of the semiconductor substrate is thus effected. The tape layer is then removed, and the polyimide layer is thereby severed in sections above the trenches.

In a variant of the dicing method, the polyimide layer is applied as a dry film spanning the trenches, in particular from a carrier tape.

In a further variant of the dicing method, the polyimide layer is provided with breaking delimitations near the trenches.

In a further variant of the dicing method, the breaking delimitations are formed by gaps in the polyimide layer.

In a further variant of the dicing method, the polyimide layer is photosensitive, and the breaking delimitations are formed using photolithography.

A further variant of the dicing method comprises providing the integrated circuit regions with contact pads, which are not covered by the polyimide layer, and applying bump contacts before the tape layer is applied, each bump contact being electrically connected with one of the contact pads.

A further variant of the dicing method comprises applying an electrically conductive layer on the polyimide layer, sections of the electrically conductive layer contacting the contact pads, applying a cover layer on the electrically conductive layer, areas of the electrically conductive layer not being covered by the cover layer, applying underbump metallizations and bump contacts on the uncovered areas of the electrically conductive layer before the tape layer is applied, and applying the tape layer on the cover layer.

In a further variant of the dicing method, the cover layer is applied by spinning a liquid polyimide layer on.

A further variant of the dicing method comprises applying a dicing foil to the semiconductor substrate after the trenches have been opened and before the tape layer is removed, the dicing foil being so flexible as to allow the polyimide layer to be severed by breaking.

The semiconductor chip comprises a semiconductor substrate with an integrated circuit region provided with a contact pad, a polyimide layer arranged above the integrated circuit region without covering the contact pad, a bump contact electrically connected with the contact pad, and a cover layer on the polyimide layer laterally confining the polyimide layer. In particular, the cover layer may be a further polyimide layer.

An embodiment of the semiconductor chip further comprises an electrically conductive layer on the polyimide layer, a portion of the electrically conductive layer contacting the contact pad, and an underbump metallization and the bump contact being applied to the electrically conductive layer.

In a further embodiment the cover layer does not cover the bump contact.

In particular, the lateral confinement of the polyimide layer by the cover layer is provided as breaking delimitations for wafer dicing.

The following is a detailed description of examples of the dicing method and the semiconductor chip in conjunction with the appended figures.

BRIEF DESCRIPTION OF THE DRAWINGS

FIG. 1 is a cross section of a wafer after IC processing and formation of scribe lines for chip dicing.

FIG. 2 is a cross section according to FIG. 1 after formation of dicing trenches.

FIG. 5 is a cross section according to FIG. 4 after application of an electrically conductive layer.

FIG. 6 is a cross section according to FIG. 5 after structuring the electrically conductive layer.

FIG. 7 is a cross section according to FIG. 6 after application of a cover layer.

FIG. 8 is a cross section according to FIG. 7 after structuring the cover layer.

DETAILED DESCRIPTION

Figure 3:
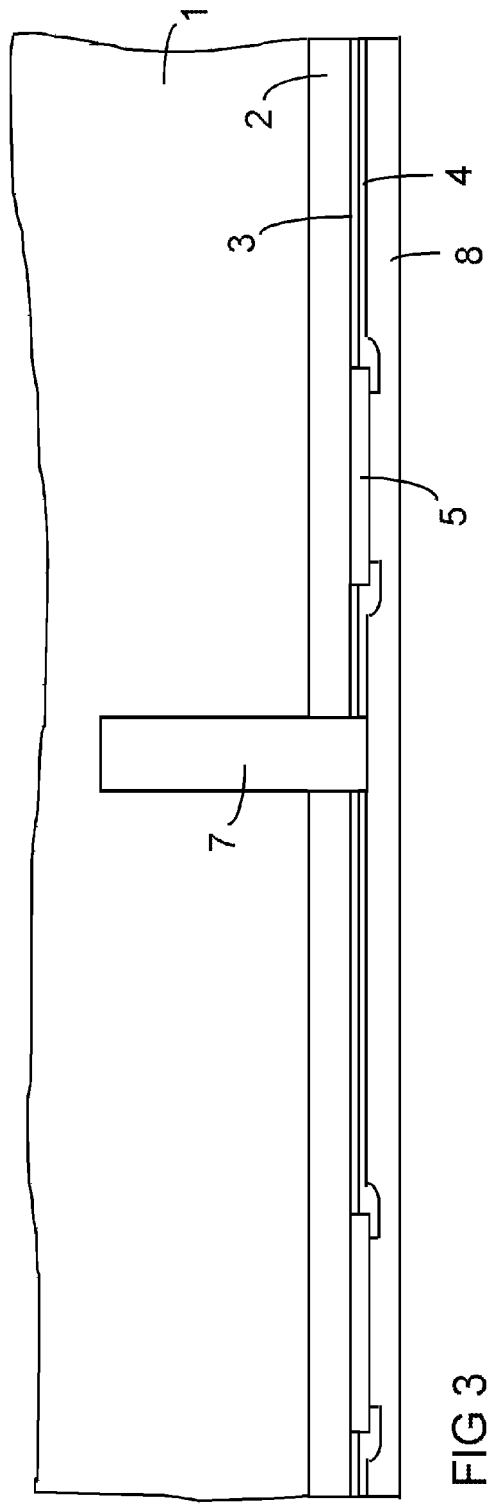
FIG. 3 is a cross section according to FIG. 2 after application of a polyimide layer.

FIG. 1 is a cross section of a semiconductor substrate 1, which may be a silicon wafer, for instance, after the production of integrated circuits, which may be CMOS circuits, for instance. Integrated circuit regions provided for semiconductor chips may each include a wiring layer 2 having structured and interconnected metal layers embedded in intermetal dielectric, and integrated circuit components 20 formed in the semiconductor substrate 1, as schematically indicated in FIG. 1 by broken contours. The integrated circuit regions 2, 20 may be produced by a standard CMOS processes, for instance. Details of the integrated circuit regions 2, 20 are not relevant and are therefore not shown in FIG. 1. The surface of the wiring layer 2 may be passivated by one or more dielectric layers. The embodiment according to FIG. 1 comprises a first passivation layer 3, which may be nitride, for instance, and a second passivation layer 4, which may be oxide, for instance. Contact pads 5 for external electric connections of some or all of the integrated circuit components 20 may be arranged in or on the wiring layer 2. The passivation layers 3, 4 do not completely cover the contact pads 5.

The semiconductor substrate 1 shown in FIG. 1 is to be separated into single semiconductor chips by dicing, which can be performed by the dicing method described in the following. The dicing method allows to apply bump contacts for external electric connections before the semiconductor substrate 1 is cut into the individual semiconductor chips. Scribe lines 6 for dicing are defined by openings in the passivation layers 3, 4 and the wiring layer 2 at the chip boundaries where the semiconductor substrate 1 is to be cut.

FIG. 2 is a cross section according to FIG. 1 for an intermediate product of the dicing method after a formation of trenches 7 in the semiconductor substrate 1 below the scribe lines 6. Elements of the intermediate product according to FIG. 2 that correspond to elements shown in FIG. 1 are designated with the same reference numerals. The trenches 7, which do not cut through the semiconductor substrate 1, are provided to facilitate the dicing step. The width w of the trenches 7 may be typically as small as about 15 µm, for example, and the depth d of the trenches 7 may be typically about 200 µm, for example.

FIG. 3 is a cross section according to FIG. 2 for a further intermediate product of the dicing method after application of a polyimide layer 8. Elements of the further intermediate product according to FIG. 3 that correspond to elements shown in FIG. 2 are designated with the same reference numerals. The polyimide layer 8 is applied as an entire layer on the surface above the integrated circuit regions 2, 20 and the trenches 7, which are spanned by the polyimide layer 8, so that the trenches 7 form closed voids. The polyimide layer 8 can be applied as a dry film, which may be laminated from a carrier tape. In particular, the polyimide layer 8 may comprise a photosensitive material. If the photosensitive material is not yet fully polymerized after the application of the polyimide layer 8, it can be structured using photolithography. This may be useful in a subsequent method step for uncovering the contact pads 5.

Figure 4:
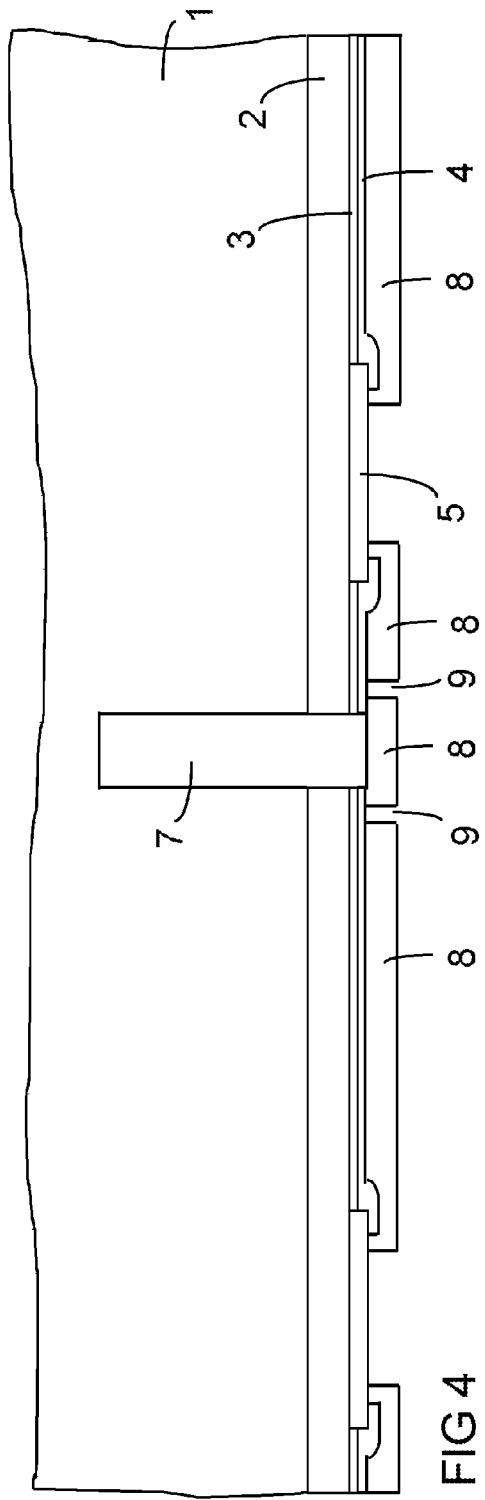
FIG. 4 is a cross section according to FIG. 3 after structuring the polyimide layer.

FIG. 4 is a cross section according to FIG. 3 for a further intermediate product of the dicing method after structuring the polyimide layer 8. Elements of the further intermediate product according to FIG. 4 that correspond to elements shown in FIG. 3 are designated with the same reference numerals. The polyimide layer 8 is structured to uncover the contact pads 5. Elongate predetermined breaking points, which will in this context be termed breaking delimitations 9, may favorably be formed by gaps in the polyimide layer 8 along the edges of the trenches 7, as shown in FIG. 4. The purpose of the breaking delimitations 9 and their advantage for the dicing method will become clear from the following description.

FIG. 5 is a cross section according to FIG. 4 for a further intermediate product of the dicing method after application of an electrically conductive layer 10. Elements of the further intermediate product according to FIG. 5 that correspond to elements shown in FIG. 4 are designated with the same reference numerals. The electrically conductive layer 10 may be formed by sputtering a metal layer, for example. The electrically conductive layer 10 contacts the contact pads 5 and thus provides electric connections of the contact pads 5.

FIG. 6 is a cross section according to FIG. 5 for a further intermediate product of the dicing method after structuring the electrically conductive layer 10. Elements of the further intermediate product according to FIG. 6 that correspond to elements shown in FIG. 5 are designated with the same reference numerals. The electrically conductive layer 10 is removed from regions including areas above the trenches 7, and especially from the gaps of the polyimide layer 8 that form the breaking delimitations 9. The electrically conductive layer 10 may be structured into conductor tracks or the like, according to individual requirements, especially if the electrically conductive layer 10 is provided as a redistribution layer.

FIG. 7 is a cross section according to FIG. 6 for a further intermediate product of the dicing method after application of a cover layer 11. Elements of the further intermediate product according to FIG. 7 that correspond to elements shown in FIG. 6 are designated with the same reference numerals. The cover layer 11 is applied on the polyimide layer 8 and the electrically conductive layer 10. The cover layer 11 may especially be a further polyimide layer, for example, which can be applied as a liquid polyimide layer, because the surface formed by the polyimide layer 8 and the electrically conductive layer 10 is sufficiently smooth.

FIG. 8 is a cross section according to FIG. 7 for a further intermediate product of the dicing method after structuring the cover layer 11. Elements of the further intermediate product according to FIG. 8 that correspond to elements shown in FIG. 7 are designated with the same reference numerals. The cover layer 11 is opened above contact areas of the electrically conductive layer 10 where bump contacts are to be arranged. Furthermore, the cover layer 11 may be removed above the trenches 7.

Figure 9:
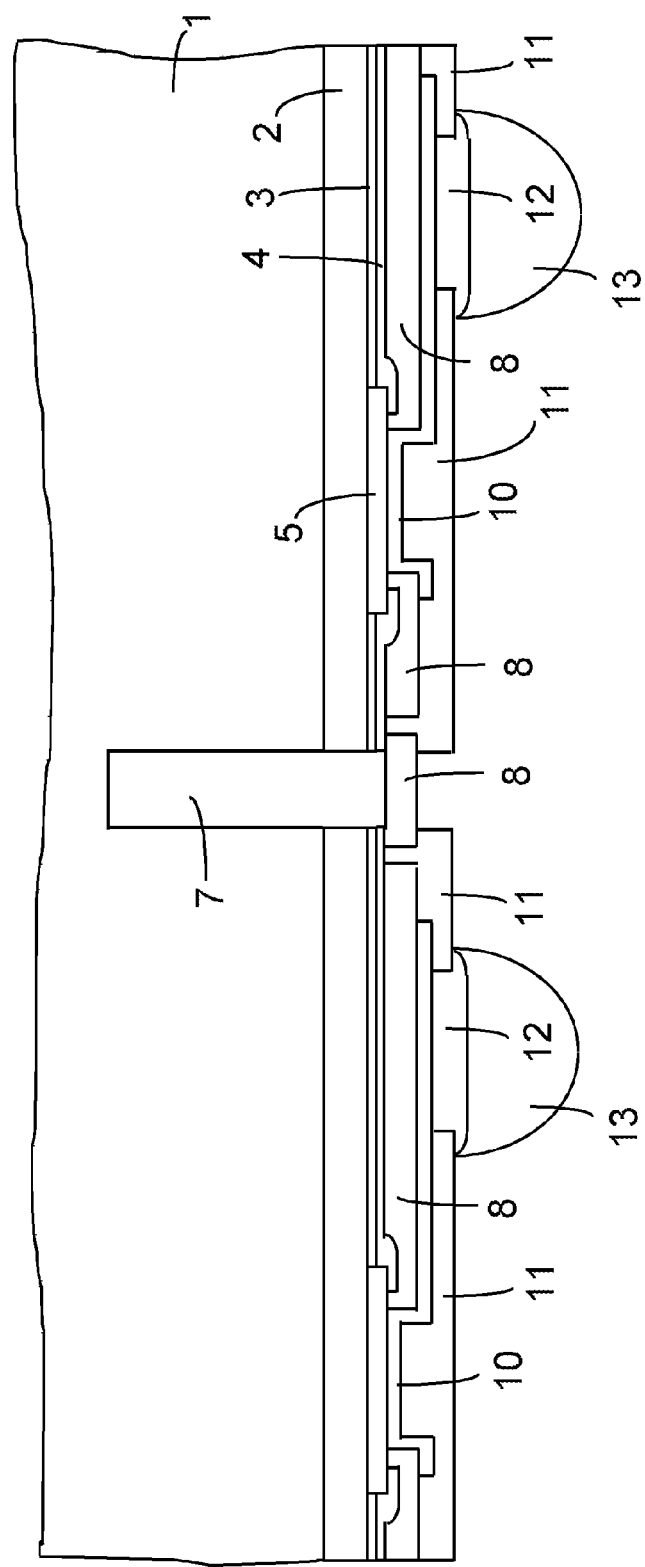
FIG. 9 is a cross section according to FIG. 8 after application of bump contacts.

FIG. 9 is a cross section according to FIG. 8 for a further intermediate product of the dicing method after application of bump contacts 13. Elements of the further intermediate product according to FIG. 9 that correspond to elements shown in FIG. 8 are designated with the same reference numerals. In the embodiment according to FIG. 9, external electric connections are represented by bump contacts as an example, which may be employed in conjunction with the described method. But any other conventional application of electric connections, like wire bonding, for instance, may also be suitable. If bump contacts are to be applied, underbump metallizations 12 are optionally formed on the contact areas of the electrically conductive layer 10. The underbump metallizations 12 can be any conventional underbump metallizations known from semiconductor technology and can especially be produced by electroless NiAu plating, for example. Bump contacts 13, which may be formed by solder balls, for example, are then arranged on the underbump metallizations 12. The bump contacts 13 may be applied by conventional process steps.

Figure 10:
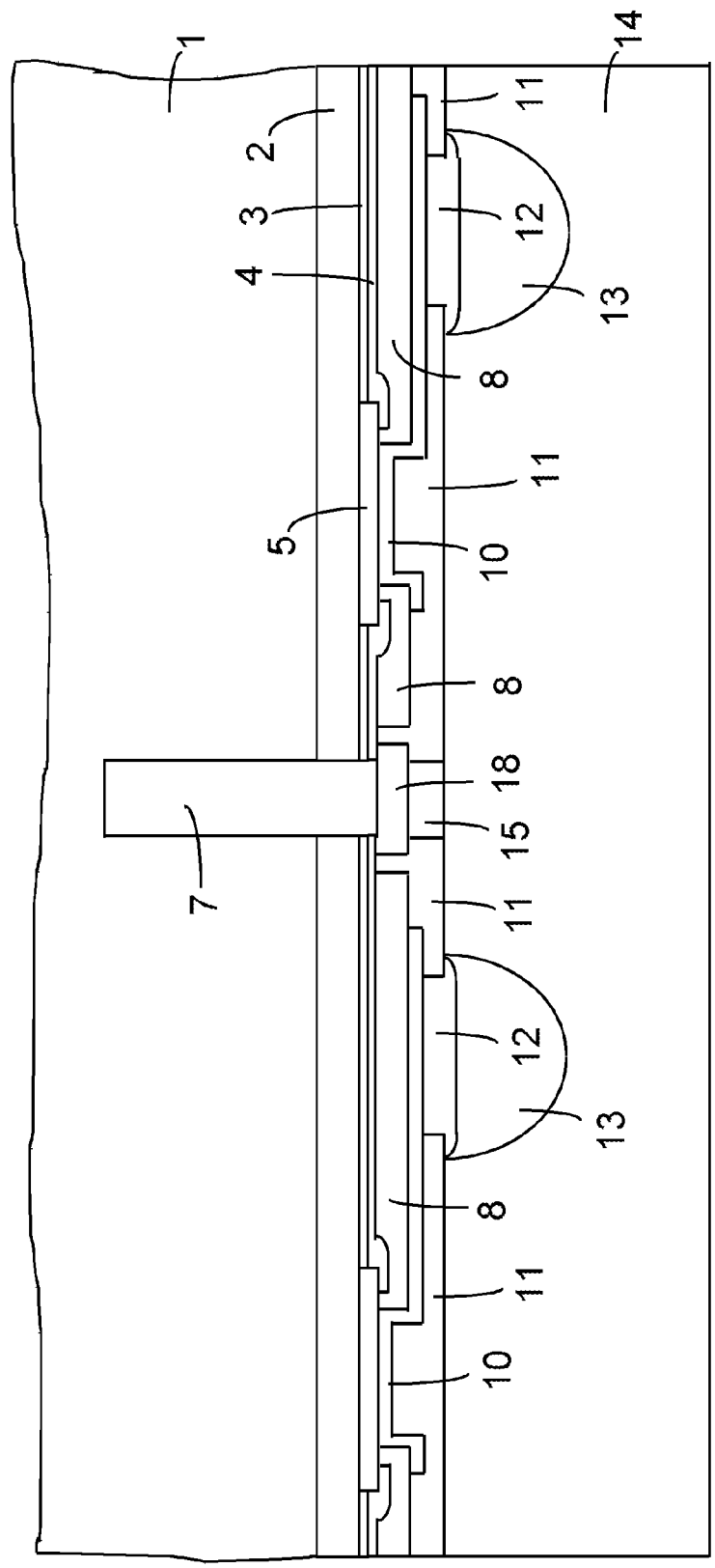
FIG. 10 is a cross section according to FIG. 9 after application of a grinding tape layer.

FIG. 10 is a cross section according to FIG. 9 for a further intermediate product of the dicing method after application of a tape layer 14. Elements of the further intermediate product according to FIG. 10 that correspond to elements shown in FIG. 9 are designated with the same reference numerals. The tape layer 14 may be applied by laminating, for example. A cavity 15 may remain between the tape layer 14 and a section 18 of the polyimide layer 8 above the trenches 7 at the level of the cover layer 11. The tape layer 14 forms a grinding tape for improved handling of the intermediate product thus obtained during the following method steps, in which the semiconductor substrate 1 is thinned from the rear side. The substrate 1 can be thinned by a mechanical process like grinding, for example, which may be enhanced by chemicals.

Figure 11:
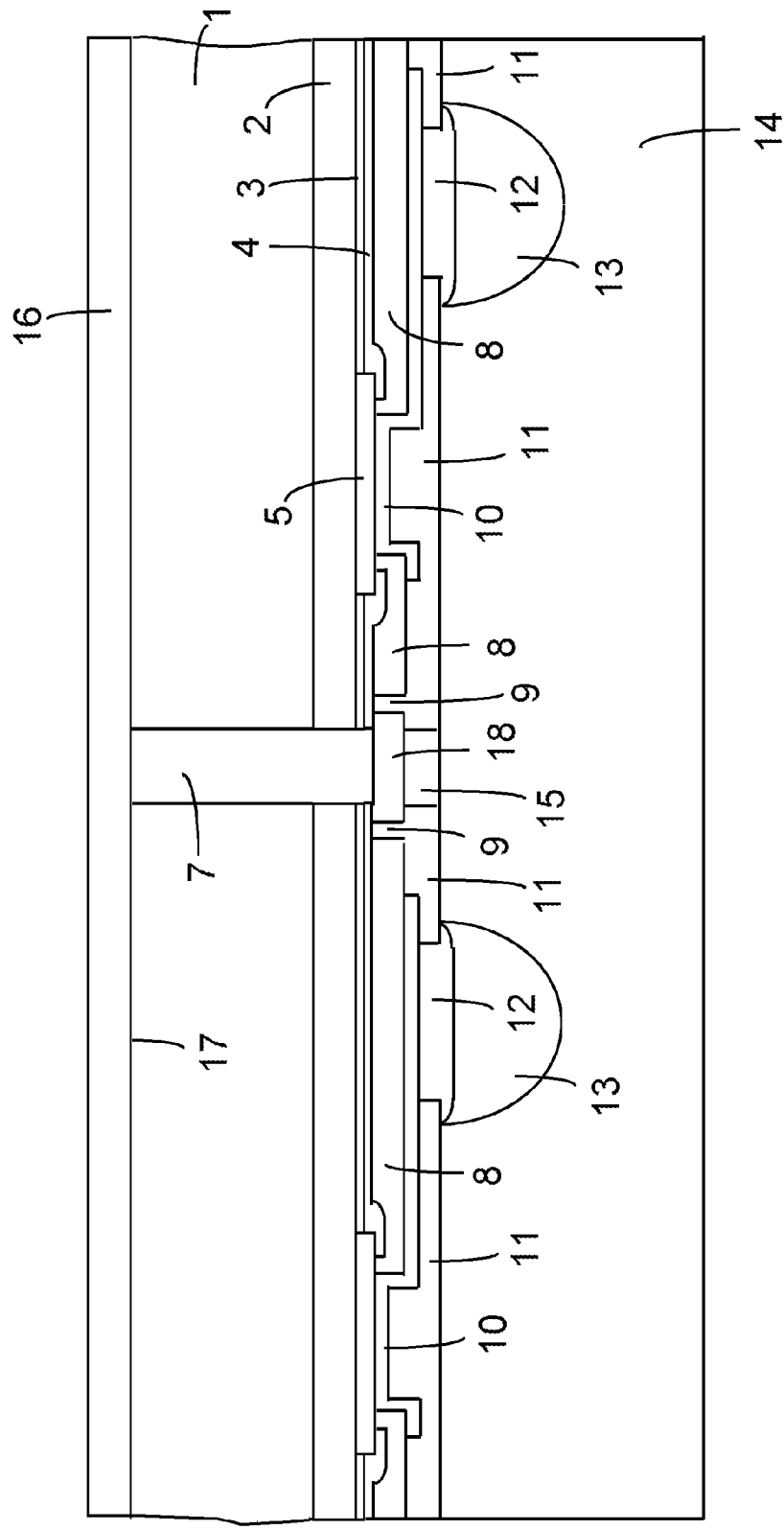
FIG. 11 is a cross section according to FIG. 10 after grinding.

FIG. 11 is a cross section according to FIG. 10 for a further intermediate product of the dicing method after grinding. Elements of the further intermediate product according to FIG. 11 that correspond to elements shown in FIG. 10 are designated with the same reference numerals. FIG. 11 shows how the semiconductor substrate 1 has been thinned by removing a layer portion of the substrate 1, until the trenches 7 are opened from the rear side and dicing is thus effected. A dicing foil 16 may be applied to the substrate side 17 opposite the tape layer 14, so that the trenches 7 are closed again and form voids. The dicing foil 16 secures the semiconductor chips when they are released by removing the tape layer 14. When the tape layer 14 has been removed, the only remaining connection between the semiconductor chips is formed by the dicing foil 16 and by a section 18 of the polyimide layer 8 that is present above the trenches 7 and in particular between the gaps forming the breaking delimitations 9. The dicing foil 16 may be sufficiently flexible to allow the polyimide layer 8 to be severed by breaking at the section 18.

Figure 12:
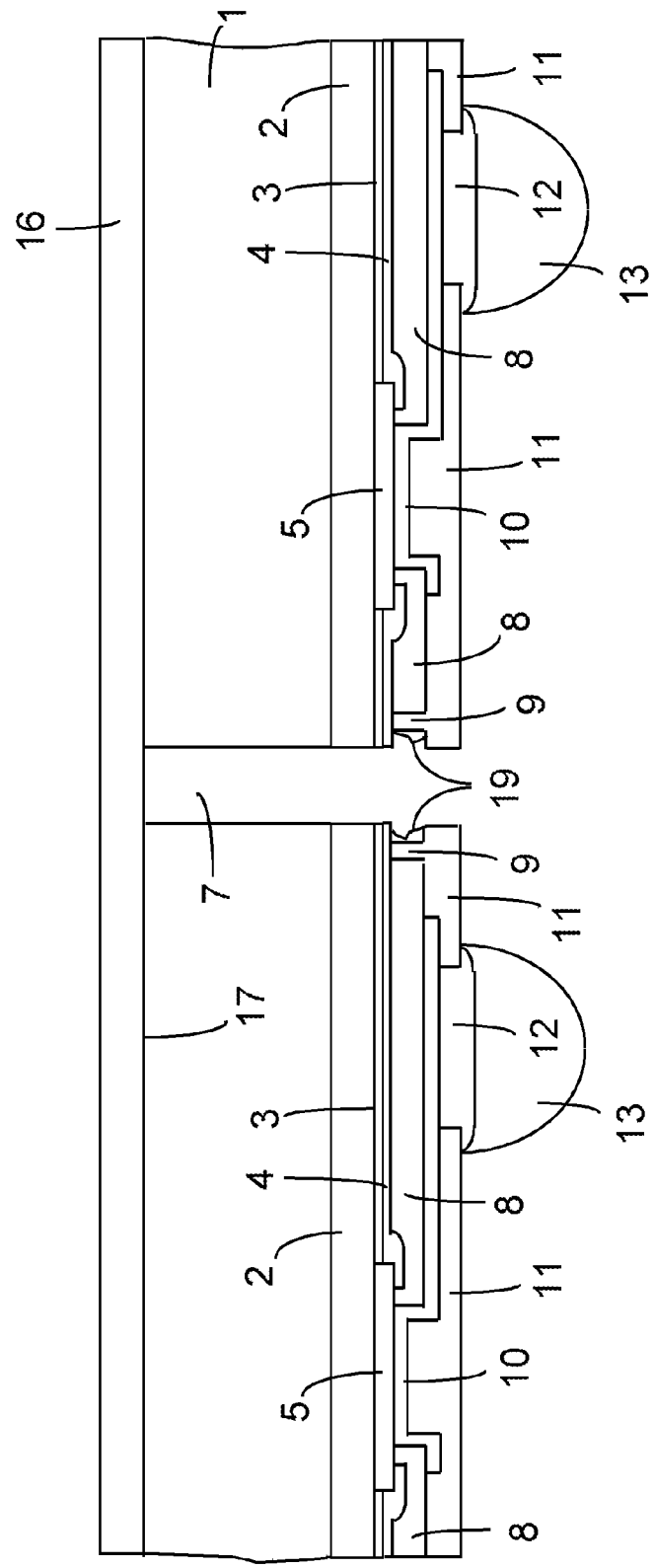
FIG. 12 is a cross section according to FIG. 11 after removing the grinding tape layer.

FIG. 12 is a cross section according to FIG. 11 for a further intermediate product of the dicing method after removing the tape layer 14. Elements of the further intermediate product according to FIG. 12 that correspond to elements shown in FIG. 11 are designated with the same reference numerals. FIG. 12 shows the product obtained after dicing, with the singled semiconductor chips sticking to the dicing foil 16. Remnants 19 of the polyimide layer 8 may be left at the breaking delimitations 9, which preserve smooth lateral edges above the wiring layers 2 and passivation layers 3, 4 of the semiconductor chips at the locations where the polyimide layer 8 is severed. Subsequently removing the dicing foil 16 will yield a plurality of individual semiconductor chips.

FIG. 12 also shows the structure of a semiconductor chip that is especially suitable for an application of this dicing method. A cover layer 11, which does optionally not cover the bump contacts 13, is arranged on the polyimide layer 8 in such a manner that the cover layer 11 laterally confines the polyimide layer 8 near the upper edge of the semiconductor chip. A smooth edge can thereby be preserved even if dicing is performed after wafer-level packaging by severing the polyimide layer 8 in sections 18 between the semiconductor chips. Breaking delimitations 9 achieved by this structure secure that the sections 18 where the polyimide layer 8 is cracked are laterally confined and cannot reach over the integrated circuit regions 2, 20 or adversely affect the electric connections.

The described dicing method and semiconductor chip allow the combination of wafer level chip scale packaging (WL-CSP) with trench dicing before grinding (DBG) to obtain smooth chip edges. The use of a polyimide layer that can be laminated as a dry film covering the trenches eliminates problems arising from the surface topography and enables subsequent spin-on processes and other standard process steps. The scribe width can be substantially reduced, typically from about 80 µm to about 15 µm, the yield of good dies per wafer can be maximized, and the wafers can be processed at their full thickness until the end of the process flow, thus reducing the risk of wafer breakage.

The invention claimed is:

1. A dicing method for wafer-level packaging, comprising:
   providing a semiconductor substrate with integrated circuit regions;
   forming trenches in the substrate between the integrated circuit regions;
   applying a tape layer above the integrated circuit regions and above the trenches;
   removing a layer portion of the substrate from a substrate side opposite the tape layer, until the trenches are opened and dicing of the substrate is thus effected;
   removing the tape layer;
   after the formation of the trenches, applying a polyimide layer above the integrated circuit regions and above the trenches before the tape layer is applied; and
   the polyimide layer being severed above the trenches when the tape layer is removed,
   wherein the polyimide layer is provided with breaking delimitations near the trenches,
   wherein the polyimide layer is photosensitive, and
   wherein the breaking delimitations are formed using photolithography.

2. The dicing method of claim 1, wherein the polyimide layer is applied as a dry film spanning the trenches.

3. The dicing method of claim 1, wherein the breaking delimitations are formed by gaps in the polyimide layer.

4. The dicing method of claim 1, further comprising:
   the integrated circuit regions being provided with contact pads, which are not covered by the polyimide layer; and
   bump contacts being applied before the tape layer is applied, each bump contact being electrically connected with one of the contact pads.

5. A dicing method for wafer-level packaging, comprising:
   providing a semiconductor substrate with integrated circuit regions;
   forming trenches in the substrate between the integrated circuit regions;
   applying a tape layer above the integrated circuit regions and above the trenches;
   removing a layer portion of the substrate from a substrate side opposite the tape layer, until the trenches are opened and dicing of the substrate is thus effected;
   removing the tape layer;
   after the formation of the trenches, applying a polyimide layer above the integrated circuit regions and above the trenches before the tape layer is applied;
   the polyimide layer being severed above the trenches when the tape layer is removed;
   the integrated circuit regions being provided with contact pads, which are not covered by the polyimide layer;
   bump contacts being applied before the tape layer is applied, each bump contact being electrically connected with one of the contact pads;
   an electrically conductive layer being applied on the polyimide layer, sections of the electrically conductive layer contacting the contact pads;
   a cover layer being applied on the electrically conductive layer, areas of the electrically conductive layer not being covered by the cover layer;
   underbump metallizations and the bump contacts being applied on the uncovered areas of the electrically conductive layer before the tape layer is applied; and
   the tape layer being applied on the cover layer.

6. The dicing method of claim 5, wherein the cover layer is applied by spinning a liquid polyimide layer on.

7. The dicing method of claim 1, further comprising:
applying a dicing foil to the semiconductor substrate after the trenches are opened and before the tape layer is removed, the dicing foil being so flexible as to allow the polyimide layer to be severed by breaking.

8. The dicing method of claim 4, further comprising:
an electrically conductive layer being applied on the polyimide layer, sections of the electrically conductive layer contacting the contact pads;
a cover layer being applied on the electrically conductive layer, areas of the electrically conductive layer not being covered by the cover layer;
underbump metallizations and the bump contacts being applied on the uncovered areas of the electrically conductive layer before the tape layer is applied; and
the tape layer being applied on the cover layer.

9. The dicing method of claim 5, wherein the polyimide layer is applied as a dry film spanning the trenches.

10. The dicing method of claim 5, further comprising:
applying a dicing foil to the semiconductor substrate after the trenches are opened and before the tape layer is removed, the dicing foil being so flexible as to allow the polyimide layer to be severed by breaking.

* * * * *